(12) United States Patent
Song et al.

(10) Patent No.: US 9,035,325 B2
(45) Date of Patent: May 19, 2015

(54) LIGHT EMITTING DEVICE PACKAGE AND LIGHTING SYSTEM

(75) Inventors: Yong Seon Song, Seoul (KR); Jung Ha Hwang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 384 days.

(21) Appl. No.: 12/911,466

(22) Filed: Oct. 25, 2010

(65) Prior Publication Data

US 2011/0095321 A1    Apr. 28, 2011

(30) Foreign Application Priority Data

Oct. 26, 2009  (KR) .................. 10-2009-0101703

(51) Int. Cl.
*H01L 33/00*     (2010.01)
*H01L 33/50*     (2010.01)
*H01L 33/54*     (2010.01)

(52) U.S. Cl.
CPC ............ *H01L 33/508* (2013.01); *H01L 33/505* (2013.01); *H01L 33/54* (2013.01); *H01L 2933/0041* (2013.01); *H01L 2924/0002* (2013.01); *H01L 2224/48091* (2013.01); *H01L 2224/8592* (2013.01); *H01L 2224/45144* (2013.01)

(58) Field of Classification Search
CPC ....... H01L 25/167; H01L 33/20; H01L 33/48; H01L 33/52
USPC ........... 3/79, 88, 86, 89–93, 95–98, 100, 102, 3/103, E33.001, E33.005, E33.006, 3/E33.055–E33.061, E33.066; 257/79, 257/88, 86, 89–93, 95–100, 102, 103, 257/E33.001, E33.005, E33.006, 257/E33.055–E33.061, E33.066, E33.059; 438/48

See application file for complete search history.

(56) References Cited

U.S. PATENT DOCUMENTS

| | | |
|---|---|---|
| 2006/0273336 A1 | 12/2006 | Fujikura et al. |
| 2007/0029569 A1 | 2/2007 | Andrews |
| 2007/0138484 A1 | 6/2007 | Yamamoto et al. |
| 2007/0228387 A1 | 10/2007 | Negley et al. |
| 2008/0029775 A1 | 2/2008 | Liu et al. |
| 2008/0217637 A1* | 9/2008 | Kim et al. .................... 257/98 |

(Continued)

FOREIGN PATENT DOCUMENTS

| | | |
|---|---|---|
| CN | 1822365 | 8/2006 |
| CN | 101278410 | 10/2008 |

(Continued)

OTHER PUBLICATIONS

Korean Office Action dated May 13, 2011.

(Continued)

*Primary Examiner* — Daniel Whalen
*Assistant Examiner* — Suberr Chi
(74) *Attorney, Agent, or Firm* — Ked & Associates LLP (57) ABSTRACT

A light emitting device (LED) package includes a submount and a light emitting chip. The submount has a chip region and a supporting region over which the chip is mounted, and an encapsulating material and fluorescent material are formed over the chip. The coverage area of encapsulating and fluorescent materials is substantially coextensive with the chip or chip region, and a first area between an edge of the chip region and an edge of the supporting region is greater than a second area between the edge of the chip region and the chip.

18 Claims, 6 Drawing Sheets

(56) References Cited

U.S. PATENT DOCUMENTS

| | | |
|---|---|---|
| 2008/0246044 A1 | 10/2008 | Pang |
| 2009/0075412 A1 | 3/2009 | Lee et al. |
| 2009/0231833 A1 | 9/2009 | Miki et al. |
| 2009/0315053 A1* | 12/2009 | Lee et al. ............... 257/98 |
| 2010/0148196 A1 | 6/2010 | Kamada et al. |
| 2010/0171143 A1* | 7/2010 | Paek et al. ............... 257/99 |
| 2011/0053297 A1 | 3/2011 | Andrews |
| 2011/0089453 A1* | 4/2011 | Min ............... 257/98 |

FOREIGN PATENT DOCUMENTS

| | | |
|---|---|---|
| CN | 101438424 | 5/2009 |
| EP | 1179858 | 2/2002 |
| EP | 1693904 | 8/2006 |
| JP | 2005-317592 | 11/2005 |
| KR | 10-2005-0089490 | 9/2005 |
| KR | 10-0631981 | 9/2006 |
| KR | WO 2007/004775 | 1/2007 |
| KR | WO 2007/015606 | 2/2007 |
| KR | 10-2007-0093551 | 9/2007 |
| KR | 10-0771792 | 10/2007 |
| KR | 10-2008-0059224 A | 6/2008 |
| KR | 10-2008-00170414 | 7/2008 |
| KR | 10-2008-0110878 A | 12/2008 |
| KR | 10-2009-0051508 | 5/2009 |
| TW | 200707814 | 2/2007 |
| WO | WO 2007/126836 | 11/2007 |

OTHER PUBLICATIONS

Chinese Office Action dated Jun. 26, 2012.
European Search Report dated Apr. 4, 2012.
Korean Office Action dated Sep. 23, 2011.

\* cited by examiner

LIGHT EMITTING DEVICE PACKAGE AND LIGHTING SYSTEM

CROSS-REFERENCE TO RELATED APPLICATIONS

The present application claims priority under 35 USC §119 to Korean Patent Application No. 10-2009-0101703 filed Oct. 26, 2009, which is hereby incorporated by reference in its entirety.

BACKGROUND

1. Field

One or more embodiments described herein relate to the emission of light.

2. Background

A p-n junction diode is one type of light emitting device (LED) that converts electrical energy into light. The diode may be formed by combining Group III and Group V elements from the periodic table, and the color (red, green, or blue) of the light may be set based on a composition ratio of the semiconductor material used for form the junction.

A white light emitting device package may be formed in a variety of ways from colored LEDs. One technique involves combining red, green, and blue LEDs and then adding a yellow fluorescent material (e.g., YAG, TAG, etc.) to the blue LED. Another technique involves adding red, green, and blue fluorescent material to a UV emitting device. While white light LED packages have proven desirable for many applications, they have drawbacks that diminish their reliability, stability, and performance.

DETAILED DESCRIPTION

Figure 1:
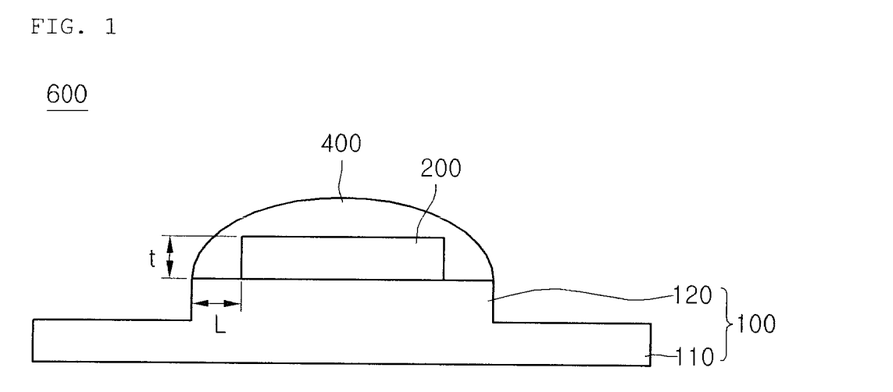
FIG. 1 is a diagram showing in cross-section a first embodiment of a light emitting device package.

FIG. 1 shows a first embodiment of a light emitting device package 600 which is formed from a submount 100 that includes a chip region 120 and a supporting region 110. A light-emitting device chip 200 is formed over the chip region and a fluorescent material (not shown) is formed over the light emitting device chip 200.

As shown, a horizontal length (L) of one area of a top surface of the chip region where the light emitting device chip 200 is not attached may be about 1 to 10 times greater than a thickness (t) of the light emitting device chip 200. An encapsulating material 400 formed over the chip may have a semi-spherical or other shape. According to one arrangement, the encapsulating material 400 may be formed on or to cover chip region 120 of the submount 100 and the light emitting device chip 200.

In this first embodiment, because the encapsulating material is formed on and/or to cover the chip region of the submount and the light emitting device chip, and not substantially on other portions of the package such as support region 110, fluorescent material applied to the package may be uniformly distributed over the area of the chip. This will result in a uniform distribution of light from the package, thereby preventing wide variations in color temperature that may diminish reliability, stability, and performance. In another embodiment, the encapsulating and fluorescent material may be formed to cover just the chip on the package 600d as FIG. 7b. The fluorescent material may be applied to the package together with mixed the encapsulating material.

Thus, in the first embodiment, because the encapsulating and fluorescent materials are formed with areas corresponding or similar to the area of the chip and/or chip region, the fluorescent material may be uniformly distributed around the chip. In this regard, the encapsulating and fluorescent materials have the same or similar areas relative to one another. In other embodiments, these areas may be different.

For example, in the case where the chip region 120 protrudes, because the light emitting device chip 200 is formed over or attached to the protruded chip region 120, and because the encapsulating material 400 and the fluorescent material is formed over or on the protruded chip region 120, the encapsulating material 400 and fluorescent material are formed with areas similar to the area of the light emitting device chip, so that the fluorescent material may be uniformly distributed around the light emitting device chip.

FIGS. 2 to 5 show results of steps included in a first embodiment of a method for manufacturing a light emitting device package. The package may, for example, be the package shown in FIG. 1 or another package.

Figure 2:
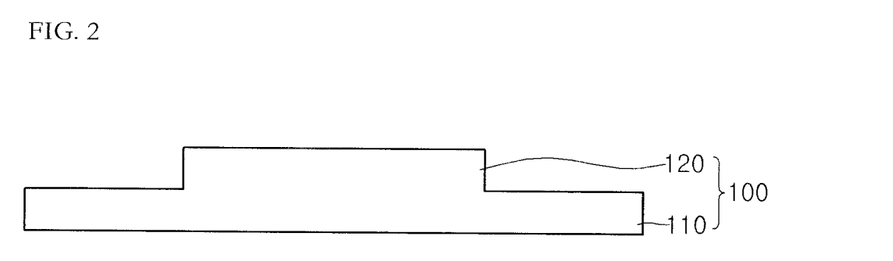
FIGS. 2 to 5 are sectional diagrams showing results of various steps of a first embodiment of a method for manufacturing a light emitting device package.

First, as shown in FIG. 2, a submount 100 is prepared. The submount 100 may be formed of a material having a heat expansion coefficient that is similar to that of a material constituting the light emitting device chip and/or having a superior thermal conductivity. For example, in one embodiment, the submount 100 may be formed of silicon (Si). However, a different material may be used in other embodiments. Also, the submount 100 may include a reflector cup (not shown), and/or a device for preventing electrostatic discharge (ESD) may be mounted in the submount 100.

Next, a chip region 120 and a supporting region 110 are formed in the submount 100. In order to form these features, a mask (not shown) having a pattern shielding the chip region 120 may be aligned over the submount 100, and then an exposed portion of the submount 100 may be etched using the mask as an etch mask to form the supporting region 110 and the chip region 120. In other embodiments, the chip and support regions may be formed using other techniques.

To form the submount including the chip region 120 and the supporting region 110, the chip region 120 of the submount may be formed such that a horizontal length (L) of one side top surface of the chip region of the submount where the light emitting device chip 200 is not attached may be about 1 to 10 times greater than a thickness (t) of the light emitting device chip 200. Therefore, the encapsulating material may be easily formed in a semi-spherical shape, elliptical or other shape.

According to one embodiment, since the encapsulating material is formed on the chip region 120 and the light emitting device chip 200 such that the fluorescent material has a similar distribution to at least the area of the chip, the fluorescent material may be uniformly distributed around the light emitting device chip. As previously indicated, the fluorescent material may be formed to have an area corresponding to or similar to both the chip and chip region.

For example, in the case where the chip region 120 protrudes, the light emitting device chip 200 is formed over or attached on the protruded chip region 120, and the encapsulating material 400 and the fluorescent material are formed with a similar distribution to the area of the light emitting device chip on the protruded chip region 120, so that the fluorescent material may be uniformly distributed around the light emitting device chip. According to one embodiment, the fluorescent material may be included with or provided with the fluorescent material so that the encapsulating and fluorescent materials are coextensive in their coverage areas.

Figure 3:
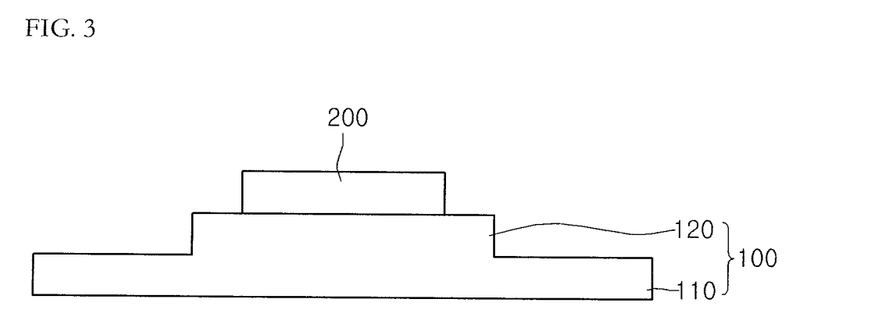
Figure 4:
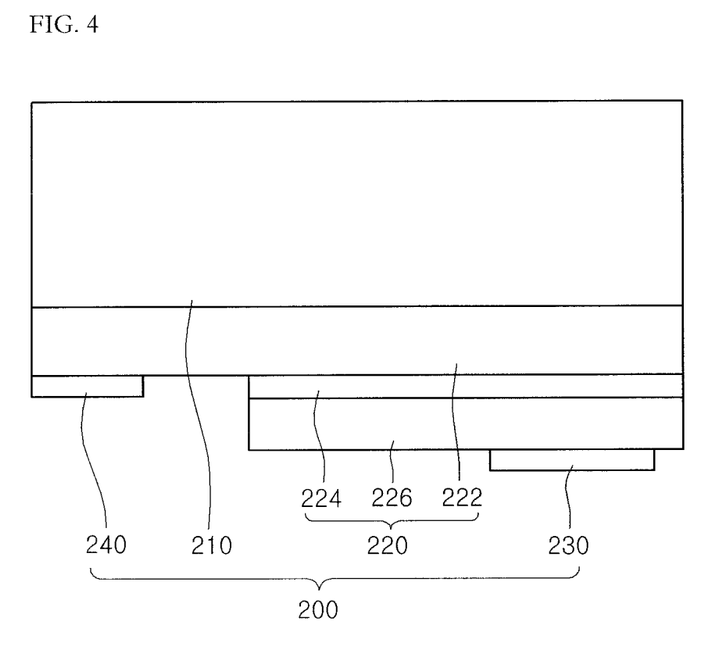

Next, as shown in FIG. 3, the light emitting device chip 200 is formed over or attached on the chip region 120 of the submount 100. The light emitting device chip 200 may be formed of a material such as GaN, GaAs, GaAsP, GaP, or the like. For example, a green~blue LED may be formed of GaN(InGaN), and a Yellow~Red LED may be formed of InGaAlP or AlGaAs. By changing the composition of the material, it is also possible to implement a full color LED. The light emitting device chip 200 in FIG. 4 is shown to be a horizontal-type light emitting device chip. However, in other embodiments, the chip may be a vertical-type chip or another type.

As shown in FIG. 4, the light emitting device chip 200 may include a light emitting structure over a substrate 210. The substrate 210 may include a conductive substrate or an insulating substrate. For example, the substrate 210 may be at least one of sapphire ($Al_2O_3$), SiC, Si, GaAs, GaN, ZnO, Si, GaP, InP, Ge and $Ga_2O_3$ substrates. While an irregular structure may be formed at an upper surface of the substrate 210, the present disclosure is not limited thereto.

The light emitting structure 220 may include a semiconductor layer 222 of a first conductivity type, an active layer 224, and a semiconductor layer 226 of a second conductivity type. The first conductivity type semiconductor layer 222 may be partially exposed. A first electrode 240 may then be formed on the first conductivity type semiconductor layer 222 and a second electrode 230 may be formed on the second conductivity type semiconductor layer 226.

The first conductivity type semiconductor layer 222 may be formed, for example, of a Group III-V compound semiconductor doped with a first conductivity type dopant. If the first conductivity type semiconductor layer 222 is an N-type semiconductor layer, the first conductivity type dopant may be an N-type dopant and, for example, may include Si, Ge, Sn, Se, and/or Te as the N-type dopant.

The first conductivity type semiconductor layer 222 may include a semiconductor material having, for example, a compositional formula of $In_xAl_yGa_{1-x-y}N$ ($0 \leq x \leq 1$, $0 \leq y \leq 1$, $0 \leq x+y \leq 1$). According to one embodiment, the first conductivity type semiconductor layer 222 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

The active layer 224 may be formed, for example, in at least one of a single quantum well structure, a multi-quantum well (MQW) structure, a quantum-wire structure, and a quantum dot structure. For example, the active layer 224 may be formed in the MQW structure by injecting trimethyl gallium (TMGa) gas, ammonia ($NH_3$) gas, nitrogen ($N_2$) gas, and trimethyl indium (TMIn) gas. Different structures are possible in other embodiments.

Well layer/barrier layer of the active layer 224 may be formed, for example, in at least one pair structure of InGaN/GaN, InGaN/InGaN, AlGaN/GaN, InAlGaN/GaN, GaAs/AlGaAs(InGaAs), GaP/AlGaP(InGaP). Different structures are possible in other embodiments. The well layer may be formed of a material having a band gap lower than a band gap of the barrier layer.

A conductive clad layer may be formed over and/or below the active layer 224. The conductive clad layer may be formed of an AlGaN-based semiconductor and may have a band gap higher than the active layer 224.

The second conductivity type semiconductor layer 226 may include a Group III-V compound semiconductor doped with a second conductivity type dopant, for example, semiconductor material having a compositional formula of $In_xAl_yGa_{1-x-y}N$ ($0 \leq x \leq 1$, $0 \leq y \leq 1$, $0 \leq x+y \leq 1$). According to one embodiment, the second conductivity type semiconductor layer 226 may be formed of at least one of GaN, InN, AlN, InGaN, AlGaN, InAlGaN, AlInN, AlGaAs, InGaAs, AlInGaAs, GaP, AlGaP, InGaP, AlInGaP, and InP.

In the case where the second conductivity type semiconductor layer 226 is a P-type semiconductor layer, the second conductivity type dopant may include Mg, Zn, Ca, Sr, Ba, or the like as a P-type dopant. The second conductivity type semiconductor layer 226 may be formed in a single-layer or multi-layer structure, however other structures are also possible.

In one embodiment, the first conductivity type semiconductor layer 222 may be implemented by an N-type semiconductor layer and the second conductivity type semiconductor layer 226 may be implemented by a P-type semiconductor layer. Alternatively, a semiconductor layer having an opposite conductivity type to the second conductivity type, for example, an N-type semiconductor layer (not shown) may be formed over the second semiconductor layer 226. Accordingly, the light emitting structure 220 may be implemented in at least one of an N-P junction structure, a P-N junction structure, an N-P-N junction structure, and a P-N-P junction structure.

Next, the attachment of the light emitting device chip 200 on the submount 100 may be performed, for example, by a flip-chip method, a method of attaching the light emitting device chip 200 using a polymer adhesive, or a method of using eutectic metal plated on the light emitting device chip.

FIG. 3 illustratively shows that the light emitting device chip 200 is attached by a flip-chip method. For example, the light emitting device chip 200 may be attached by a soldering using silver (Ag) conductive epoxy having superior processability. In the case of needing high thermal conductivity, the flip-chip bonding method or the eutectic bonding method may be employed. In other embodiments, different methods or materials of attachment may be used.

Meanwhile, in the attachment of the light emitting device chip 200 on the submount 100, the chip region 120 of the submount 100 may be formed such that a horizontal length (L) of one side top surface of the chip region 120 of the submount where the light emitting device chip 200 is not attached may be about 1 to 10 times greater than a thickness (t) of the light emitting device chip 200.

Thus, because in this embodiment the encapsulating material is formed on or over the chip region of the submount and the light emitting device chip, the fluorescent material may be distributed in an area that corresponds or is similar to the area of the chip and/or chip region. This will allow the fluorescent material to be formed with a uniform distribution around the light emitting device chip.

Figure 5:
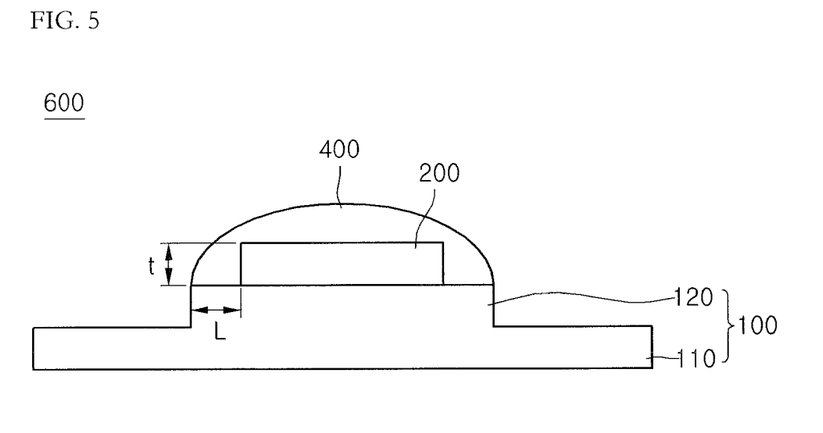

Next, as shown in FIG. 5, in order to protect the light emitting device chip and increase the light extracting efficiency, the light emitting device chip 200 may be encapsulated with the encapsulating material 400. The fluorescent material (not shown) may be included in the encapsulating material or applied on a top or bottom surface of the encapsulating material.

As shown, the encapsulating material 400 encapsulated on the light emitting device chip 200 may be formed in a semi-spherical or elliptical shape or another shape. Also, the encapsulating material 400 may be formed in a semi-spherical shape on or to cover the chip region 120 of the submount and the light emitting device chip 200. The encapsulating material 400 may be or include an epoxy encapsulating material or silicon encapsulating material, but different materials may be used in other embodiments.

In one embodiment, the light emitting device chip 200 may be a Green~Blue LED, Yellow~Red LED, UV LED, or the like, and white light may be obtained by adding the fluorescent material to the encapsulating material. For example, white light may be obtained by adding yellow fluorescent material (e.g., YAG, TAG, etc.) to a blue light emitting device, or applying red/green/blue fluorescent material to a UV light emitting device.

The fluorescent material may include a host material and an active material. For example, a combination of aluminum garnet (YAG) as the host material and cerium (Ce) as the active material, or a combination of silicate series as the host material and europium as the active material, may be employed. Different materials may be used in other embodiments.

The encapsulating process may be performed in the order of adding, mixing, discharging and curing. The encapsulation of the encapsulating material may be performed by dispensing, casting molding, or transfer molding.

In one embodiment, the encapsulating material 400 may be formed in a semi-spherical shape and may be encapsulated in a predetermined shape due to a surface tension of the encapsulating material.

Thus, because the encapsulating material is formed uniformly on the chip region 120 of the submount and the light emitting device 200 by a surface tension thereof, the fluorescent material may be distributed uniformly in the encapsulating material. Therefore, the fluorescent material may be uniformly distributed similarly to the area of the light emitting chip.

For example, in the case where the chip region 120 protrudes, since the light emitting device chip 200 is formed over or attached on the protruded chip region 120, and then the encapsulating material 400 including the fluorescent material is formed on the protruded chip region 120 similar to the area of the light emitting device chip, the fluorescent material may be distributed uniformly around the light emitting device chip.

In the embodiment, in order to uniformly form the encapsulating material on the chip region 120 of the submount and the light emitting device chip 200 by the surface tension, the surface of the chip region of the submount and the surface of the light emitting device chip may be maintained at a low wet state.

For example, if the surface of the light emitting device chip 200 is irregularly formed, because the wettability of the encapsulating material is lowered, the encapsulating material may be formed in the semi-spherical shape and thus light extracting effect can be improved.

In accordance with the aforementioned embodiments of the light emitting device package and method for manufacturing the same, because the encapsulating material is formed over or on the chip and/or chip region of the submount, the fluorescent material is allowed to be formed with a distribution area similar to the area of the light emitting device chip and/or chip region. As a result, the fluorescent material may be distributed uniformly around the light emitting device chip.

Figure 6:
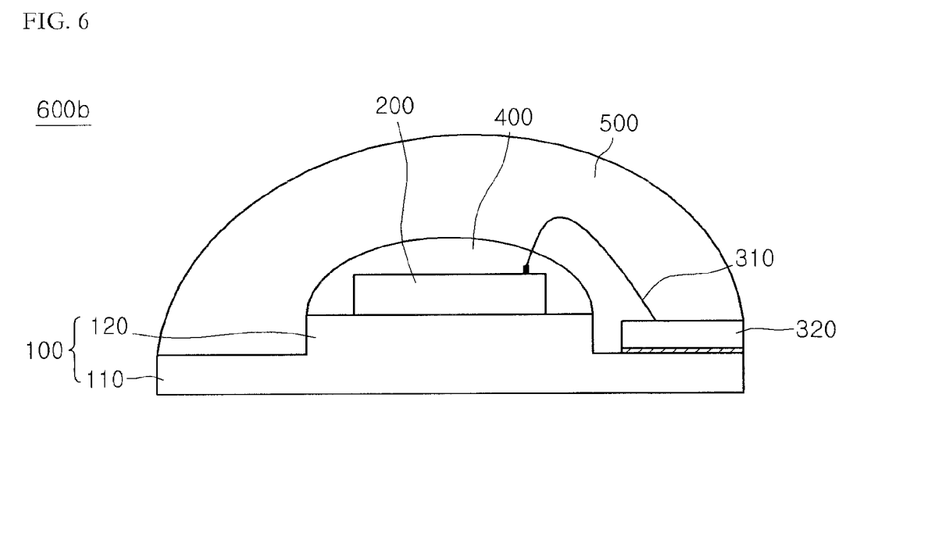
FIG. 6 is a diagram showing in cross-section a second embodiment of a light emitting device package.

FIG. 6 shows a second embodiment of a light emitting device package 600b. In this embodiment, after the light emitting device chip 200 is attached to the chip region 120, wire bonding 310 may be performed and then the encapsulating material 400 may be formed on and/or over the chip and at least a portion of the wire bond. The encapsulating material may also be formed over all or a portion of the chip region as in the case of the first embodiment.

For example, in a process other than a flip-chip process, a wire bonding process between the light emitting device chip 200 and a leadframe 320 may be performed so that current may flow into the light emitting device chip 200. For example, in the case of a vertical-type light emitting device chip, one wire bonding process may be performed. In the case of a horizontal-type light emitting device chip, two wire bonding processes may be performed. As the wire, at least one of a gold wire, copper wire, or aluminum wire may be used and the wire bonding may be performed by a ball wire bonding or an edge wire bonding.

Thereafter, an outer lens 500 may be formed on the encapsulating material 400 to enhance the light extracting effect and protect the wire 310. The outer lens 500 may be formed of the same material as the encapsulating material or a different material from the encapsulating material. In accordance with one embodiment, the outer lens does not include fluorescent material.

Figure 7A:
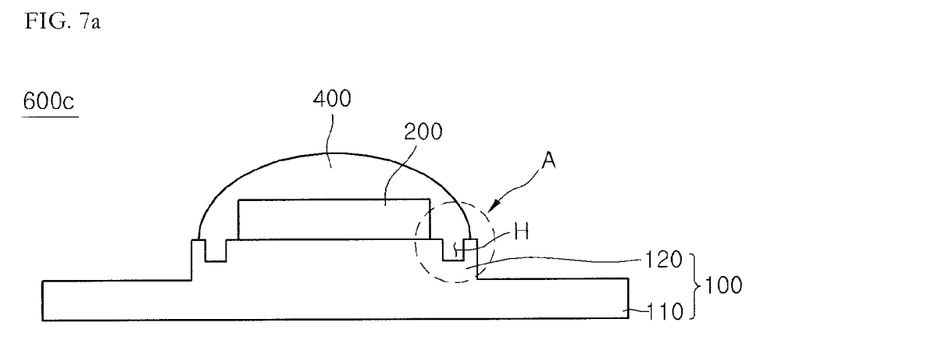
FIG. 7a is a diagram showing in cross-section a third embodiment of a light emitting device package.
Figure 7B:
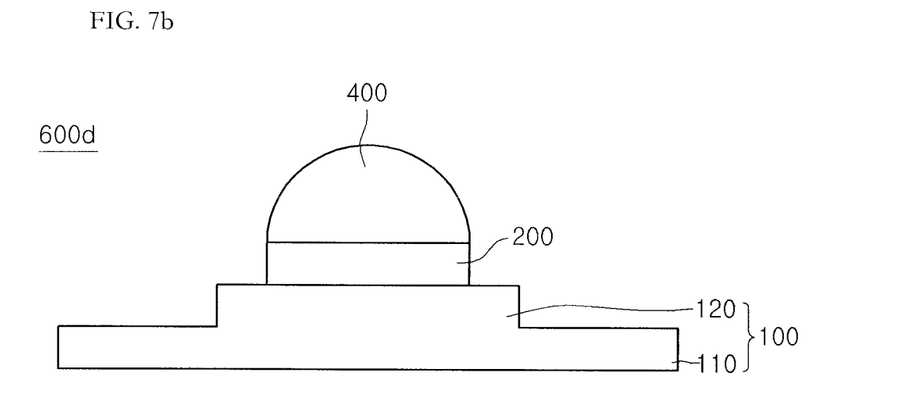
FIG. 7b is a diagram showing in cross-section a fourth embodiment of a light emitting device package.

FIG. 7 shows a third embodiment of a light emitting device package 600c. In this embodiment, after forming the chip region 120 and the supporting region 110 in the submount 100, a groove (H) may be formed in the chip region 120. For example, the groove (H) may be formed at a portion of the chip region 120 of the submount where the light emitting device chip is not attached.

For example, when the groove (H) may be formed at a portion of the chip region 120 of the submount where the light emitting device chip is not attached, the wettability of the submount is lowered to prevent the encapsulating material 400 from being spread, so that the encapsulating material may be formed in a semi-spherical, elliptical or other predetermined shape.

In accordance with these embodiments of the light emitting device package and method for manufacturing the same, because the encapsulating material is formed on the chip region of the submount and the light emitting device chip such that the fluorescent material is formed with a distribution corresponding or similar to the area of the light emitting device chip (or the chip and the chip region), the fluorescent material may be distributed uniformly around the light emitting device chip.

In accordance with one embodiment, a plurality of light emitting device packages may be arranged on a substrate and a plurality of optical members (e.g., light guide panel, prism sheet, diffusion sheet, fluorescent sheet, and/or other components) may be arranged on a path of light emitted from the light emitting device package. The light emitting device package, substrate and optical members may function as a backlight unit or lighting unit, and a lighting system may include, for example, a backlight unit, a lighting unit, an indicator unit, a lamp, a streetlamp, etc.

Figure 8:
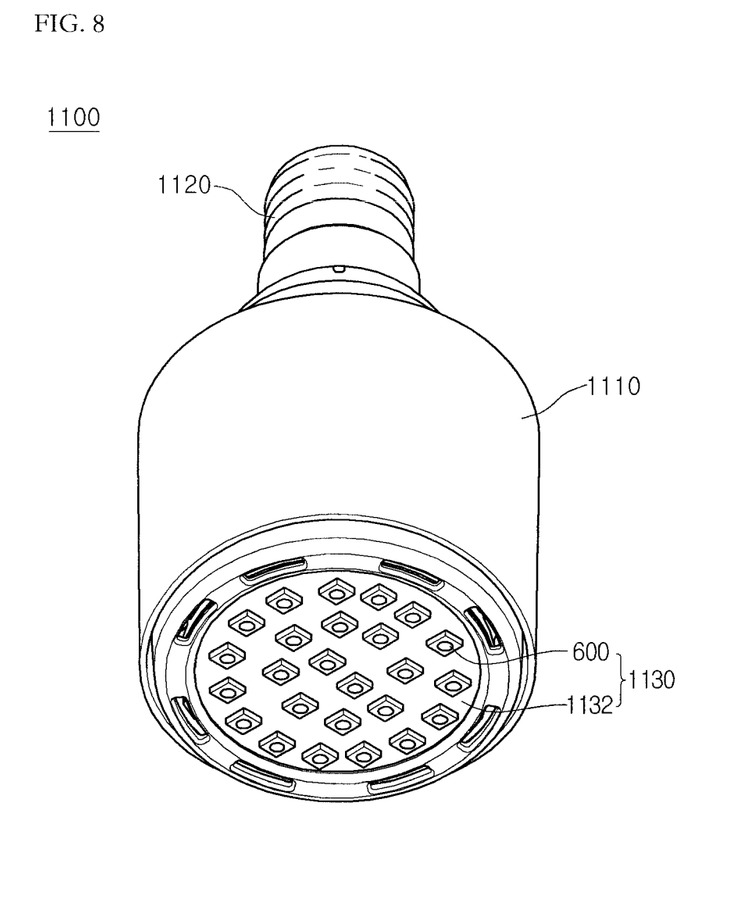
FIG. 8 is a diagram showing one embodiment of a lighting unit.

FIG. 8 shows one embodiment of a lighting unit 1100 which, for example, may be used as a lighting system. The lighting unit may include a case body 1110, a light emitting module part 1130 in case body 1110, and a connection terminal 1120 in the case body 1110 and may be supplied with an electric power from an external power supply.

The case body 110 may be formed of a material having good heat shielding characteristics, for example, a metal material or a resin material.

The light emitting module part 1130 may include a substrate 1132 and at least one light emitting device package 200 mounted on the substrate 1132.

The substrate 1132 may be an insulator substrate on which a circuit pattern is printed and may include, for example, at least one of a general printed circuit board (PCB), a metal core PCB, a flexible PCB, or a ceramic PCB. The substrate 1132 may be formed of a material to efficiently reflect light, and a surface thereof may be formed in a color capable of efficiently reflecting light, for example, white color, or silver color.

One or more light emitting device packages 600 may be mounted on the substrate 1132. Each of the light emitting device packages 600 may include at least one light emitting device (LED). The LED chip may include a color LED emitting red, green, blue or white light, and a UV LED emitting ultraviolet (UV).

The light emitting module part 1130 may have various combinations of light emitting device packages 600 so as to obtain desired color and luminance. For example, the light emitting module part 1130 may have a combination of a white LED, a red LED, and a green LED so as to obtain a high color rendering index (CRI).

The connection terminal 1120 may be electrically coupled to the light emitting module part 1130 to supply power. As shown in FIG. 8, the connection terminal 1120 may be screwed and coupled to an external power in a socket-type configuration, but the present disclosure is not limited thereto. For example, the connection terminal 1120 may be made in a pin-type inserted to receive external power or may be coupled to external power through a power line.

Figure 9:
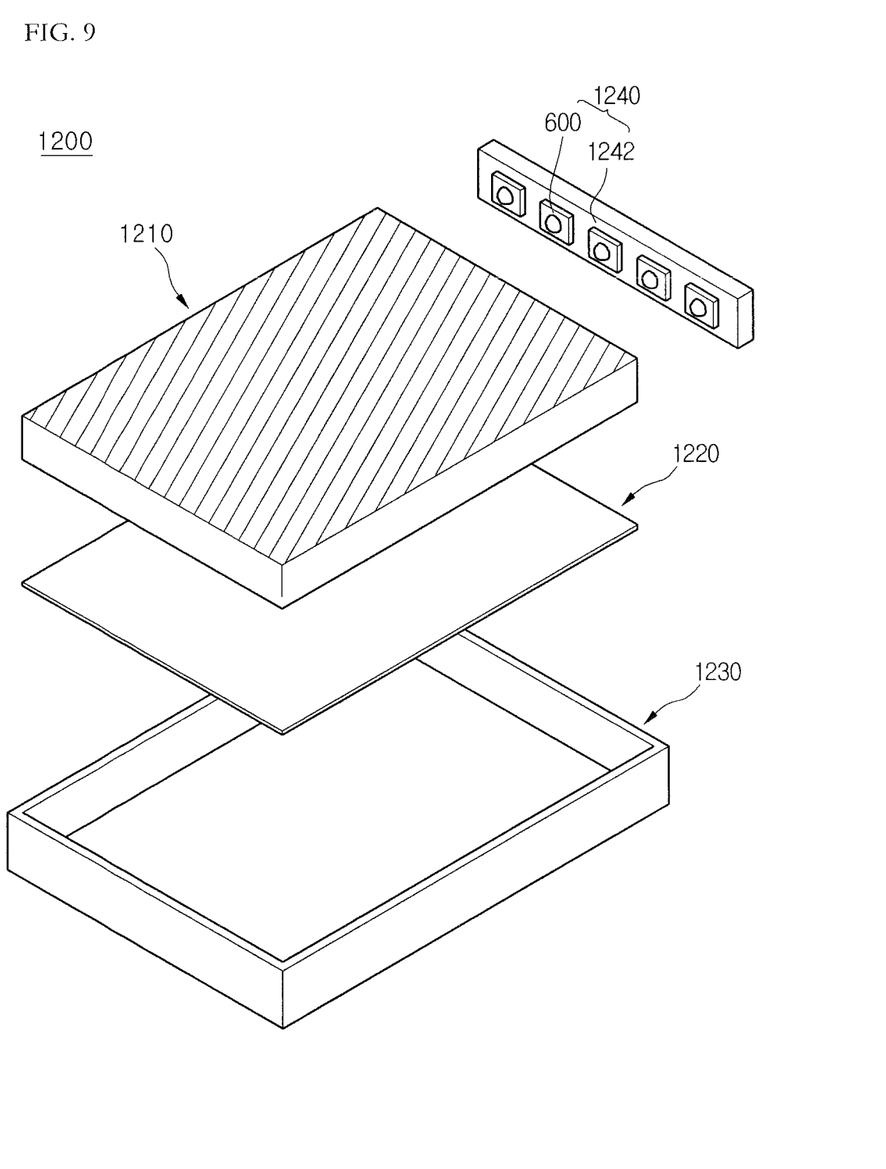
FIG. 9 is a diagram showing one embodiment of a backlight unit.

FIG. 9 shows one embodiment of a backlight unit 1200 which, for example, may be used in a lighting system. The backlight unit 1200 may include a light guide panel 1210, a light emitting module part 1240 supplying light to the light guide panel 1210, a reflective member 1220 below the light guide panel 1210, and a bottom cover 1230 receiving the light guide panel 1210, the light emitting module part 1240, and the reflective member 1220, but the present disclosure is not limited thereto.

The light guide panel 1210 functions to transform linear light to planar light by diffusing the linear light. The light guide panel may include one of acryl-series resin such as polymethyl metaacrylate (PMMA), polyethylene terephthlate (PET), poly carbonate (PC), COC, or polyethylene naphthalate resin.

The light emitting module part 1240 provides light to at least one side surface of the light guide panel 1210 and acts as a light source of, for example, a display device in which the backlight unit is equipped.

The light emitting module part 1240 may, for example, contact or otherwise be provided adjacent to the light guide panel 1210. According to one example, the light emitting module part 1240 may include a plurality of light emitting device packages 600 mounted on a substrate 1242. The substrate 1242 may, for example, contact the light guide panel 1210 or otherwise be provided adjacent to this panel.

The substrate 1242 may be, for example, a PCB including a circuit pattern (not shown). The substrate 1242 may additionally include, for example, a metal core PCB (MCPCB), a flexible PCB (FPCB), etc. as well as a general PCB.

The plurality of light emitting device packages 600 may be mounted over the substrate 1242 such that light emitting surfaces of the plurality of light emitting device packages 200 are spaced apart by a predetermined distance from the light guide panel 1210.

The reflective member 1220 may be provided below the light guide panel 1210. The reflective member 1220 reflects light incident from a bottom surface of the light guide panel to allow the reflected light to be directed toward an upper direction, thereby capable of enhancing brightness of the backlight unit. The reflective member 1220 may be formed of, for example, PET, PC, PVC resin, or the like, but the present disclosure is not limited thereto.

The bottom cover 1230 may receive the light guide panel 1210, light emitting module part 1240, and reflective member 1220. According to one example, the bottom cover 1230 is formed in a box shape having an open top surface. Furthermore, the bottom cover 1230 may be formed, for example, of a metal material or resin material and may be manufactured by using a process such as a press molding or an injection molding.

Because the lighting system according to the aforementioned embodiments include the light emitting device package previously described reliability can be enhanced.

More specifically, one or more embodiments described herein provide a light emitting device package and a lighting system that can allow a fluorescent material to be uniformly distributed around a light emitting device. These embodiments may also enhance light extraction efficiency and/or current spreading efficiency, and may be used to form derivative products such a lighting unit or system having similar improved properties.

In one embodiment, a light emitting device package comprises: a submount including a chip region and a supporting region; a light emitting device chip over the chip region of the submount; and an encapsulating material including a fluorescent material over the light emitting device chip.

In another embodiment, a lighting system comprises a light emitting module including a substrate, and a light emitting device package mounted over the substrate, wherein the light emitting device package comprises: a submount including a chip region and a supporting region; a light emitting device chip over the chip region of the submount; and an encapsulating material including a fluorescent material over the light emitting device chip.

In accordance with another embodiment, a light emitting device package comprising: a submount including a chip region and a supporting region; a light emitting chip over the chip region of the submount; and an encapsulating material and a fluorescent material over the chip, wherein the encapsulating material is at least partially transparent and wherein a coverage area of the encapsulating material and fluorescent material is substantially coextensive with the chip region.

In this package, the chip region is raised relative to the supporting region, and the encapsulating and fluorescent materials are formed to cover the chip region without substantially covering the supporting region. Also, the chip region has a top surface coupled to the chip and a portion of the top surface that is not covered by the chip has a length that is proportional to a thickness of the chip.

The length of the portion of the top surface of the chip region not covered by the chip is substantially equal to the thickness of the chip or is greater than the thickness of the chip, for example, by 2 to 10 times.

The encapsulating material may include the fluorescent material, and the fluorescent material may be distributed uniformly throughout the encapsulating material over the chip region. Furthermore, the encapsulating material may have a substantially elliptical or semi-spherical shape.

The package may additionally include a wire bonded over the chip; and an outer lens over the encapsulating material. The outer lens covers at least a portion of the supporting region.

Also a top surface of the chip region may include a groove at an area not covered by the chip, and the chip may have a non-planar surface.

In accordance with another embodiment, a lighting system includes a light emitting module including a substrate and a light emitting device package mounted over the substrate and including: (a) a submount including a chip region and a supporting region; (b) a light emitting chip over the chip region of the submount; and (c) an encapsulating material and a fluorescent material over the chip. The encapsulating material is at least partially transparent and wherein a coverage area of the encapsulating material and fluorescent material is substantially coextensive with the chip region.

In accordance with another embodiment, a light emitting device package includes a submount including a chip region and a supporting region; a light emitting chip over the chip region of the submount; and an encapsulating material and a fluorescent material over the chip. The encapsulating material is at least partially transparent, a coverage area of the encapsulating material and the fluorescent material is substantially coextensive with the chip region, and a first area between an edge of the chip region and an edge of the supporting region is greater than a second area between the edge of the chip region and the chip.

Additionally, the first area is located on a top surface of the supporting region and the second area is located on a top surface of the chip region. In one arrangement, a length of a surface between the edge of the chip region and the chip is substantially equal to a thickness of the chip, with the length being included in the second area which is not covered by the chip. In another arrangement, a length of a surface between the edge of the chip region and the chip is greater than a thickness of the chip, with the greater length being, for example, 2 to 10 times the thickness of the chip.

A top surface of the chip region may be raised relative to a top surface of the supporting region. Also, the encapsulating material may include the fluorescent material, and the fluorescent material is distributed uniformly throughout the encapsulating material over the chip region. The encapsulating material may have a substantially elliptical or semi-spherical shape.

The package may further include a wire bonded to the chip and/or a lens over the encapsulating material. The lens may cover at least a portion of the supporting region. Also, a top surface of the chip region may include a groove at a location not covered by the chip, with the groove located in the second area, and the encapsulating material may extend into the groove.

In accordance with another embodiment, a light emitting device package includes a submount including a chip region and a supporting region, a light emitting chip over the chip region of the submount; and an encapsulating material and a fluorescent material over the chip. The encapsulating material is at least partially transparent, a coverage area of the encapsulating material and fluorescent material is substantially coextensive with the chip region, and a top surface of the chip region includes at least one groove at a location not covered by the chip, the encapsulating material extending into the at least one groove. Additionally, the at least one groove may be a continuous groove and/or the top surface of the chip region includes a plurality of grooves.

In accordance with another embodiment, a light emitting device package includes a submount including a chip region and a supporting region; a light emitting chip over the chip region of the submount; a first encapsulating material over the chip; and a second encapsulating material over the first encapsulating material. The first and second encapsulating materials are at least partially transparent, the first or second encapsulating material includes a fluorescent material, a coverage area of the first encapsulating material is substantially coextensive with the chip region, and the first encapsulating material contacts the chip region and the second encapsulating material contacts a surface of the supporting region.

Additionally, the second encapsulating material may serve as an optical lens, and the first encapsulating material may include or be formed adjacent to a fluorescent material.

In accordance with another embodiment, a light emitting device package includes a submount including a chip region and a supporting region; a light emitting chip over the chip region of the submount; and an encapsulating material and a fluorescent material over the chip. The encapsulating material is at least partially transparent, and a coverage area of the encapsulating material and the fluorescent material is substantially coextensive with the chip and does not substantially overlap either of an area of the chip region not covered by the chip or an area of the supporting region not covered by the chip region.

Additionally, a length of a surface between an edge of the chip region and the chip may be substantially equal to a thickness of the chip, or may be greater than (e.g., 2 to 10 times) a thickness of the chip. Also a first area between an edge of the chip region and an edge of the supporting region may be greater than a second area between the edge of the chip region and the chip.

In accordance with another embodiment, a lighting system may be provided which includes a light emitting device package in accordance with any of the aforementioned embodiments, with the package being mounted over a substrate of a light emitting module.

Herein, it will be understood that when a layer (or film) is referred to as being 'on' another layer or substrate, that layer (or film) may be directly on another layer or substrate or intervening layers may be present. Further, when a layer is referred to as being 'under' another layer, that layer may be directly under the other layer and one or more intervening layers may be present. In addition, when a layer is referred to as being 'between' two layers, that layer may be the only layer between the two layers or one or more intervening layers may be present.

Any reference in this specification to 'one embodiment,' 'an embodiment,' 'example embodiment,' etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments. Moreover, the features of one embodiment may be combined with the features of other embodiments as described herein.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
   a submount including a chip region and a supporting region;
   a light emitting chip over the chip region of the submount; and
   an encapsulating material and a fluorescent material over the chip, wherein:
   the encapsulating material is at least partially transparent,
   a coverage area of the encapsulating material and fluorescent material is substantially coextensive with the chip region,
   a top surface of the chip region includes at least one groove between the light emitting chip and an edge of the chip region, the encapsulating material extending into the at least one groove, and
   the chip region comprises a sidewall, wherein a bottom-most portion of the sidewall is lower than the at least one groove,
   wherein a lateral width of a third region between the at least one groove and the chip is smaller than a lateral width of the supporting region.

2. The package of claim 1, wherein the at least one groove is a continuous groove.

3. The package of claim 1, wherein the top surface of the chip region includes a plurality of grooves.

4. The package of claim 1, wherein the top surface of the chip region is higher than a top surface of the supporting region.

5. The package of claim 1, wherein the groove is formed inside the top surface of the chip region of the submount.

6. The package of claim 1, wherein the groove is formed in a top most surface of the chip region, wherein the top most surface of the chip region comprises silicon.

7. The package of claim 1, wherein the lateral width of the third region between the at least one groove and the chip is smaller than a lateral width of the at least one groove.

8. The package of claim 1, wherein the encapsulating material vertically overlaps with the chip region, and
   wherein the encapsulating material does not vertically overlap with the supporting region.

9. The package of claim 1, wherein the chip region comprises a same material as the supporting region.

10. The package of claim 1, wherein the encapsulating material comprises one encapsulating layer.

11. The package of claim 1, wherein a first area between an edge of the chip region and an edge of the supporting region is greater than a second area between the edge of the chip region and the chip.

12. The package of claim 11, wherein the first area is located on a top surface of the supporting region and the second area is located on a top surface of the chip region.

13. The package of claim 1, wherein a length of a surface between the edge of the chip region and the chip is substantially equal to a thickness of the chip.

14. The package of claim 1, wherein a length of a surface between the edge of the chip region and the chip is greater than a thickness of the chip.

15. The package of claim 1, wherein the encapsulating material has a substantially elliptical or semi-spherical shape.

16. The package of claim 1, wherein the at least one groove is disposed between the light emitting chip and the edge of the chip region.

17. The package of claim 1, wherein the chip region protrudes vertically beyond the supporting region.

18. A lighting system including the package of claim 1, wherein the package is mounted over a substrate of a light emitting module.

* * * * *